(12) United States Patent
Wang

(10) Patent No.: US 9,930,803 B1
(45) Date of Patent: Mar. 27, 2018

(54) MOUNTING APPARATUS FOR MEMORY CARD

(71) Applicant: HONGFUJIN PRECISION ELECTRONICS (TIANJIN) CO., LTD., Tianjin (CN)

(72) Inventor: Wen-Chen Wang, New Taipei (TW)

(73) Assignee: HONGFUJIN PRECISION ELECTRONICS (TIANJIN) C, Tianjin (CN)

( * ) Notice: Subject to any disclaimer, the term of this patent is extended or adjusted under 35 U.S.C. 154(b) by 0 days.

(21) Appl. No.: 15/490,848

(22) Filed: Apr. 18, 2017

(30) Foreign Application Priority Data

Apr. 7, 2017 (CN) .......................... 2017 1 0225253

(51) Int. Cl.
*G06F 1/16* (2006.01)
*H05K 7/14* (2006.01)

(52) U.S. Cl.
CPC ................................. *H05K 7/1487* (2013.01)

(58) Field of Classification Search
CPC .... H05K 7/1487; H05K 7/1409; G06F 1/186; G06F 1/187

USPC ........... 248/636; 361/679.31, 679.33, 679.58
See application file for complete search history.

(56) References Cited

U.S. PATENT DOCUMENTS

| | | | | |
|---|---|---|---|---|
| 7,465,197 B1* | 12/2008 | Wu | ........................ | H01R 27/00 |
| | | | | 439/136 |
| 2002/0082729 A1* | 6/2002 | Tsao | ..................... | H01R 12/716 |
| | | | | 700/90 |
| 2004/0056095 A1* | 3/2004 | Yiu | ...................... | G06K 7/0021 |
| | | | | 235/441 |
| 2012/0162894 A1* | 6/2012 | Lin | ........................ | G06F 1/187 |
| | | | | 361/679.31 |
| 2014/0118921 A1* | 5/2014 | Lin | ........................ | G06F 1/187 |
| | | | | 361/679.33 |
| 2015/0124393 A1* | 5/2015 | Lin | ........................ | G06F 1/187 |
| | | | | 361/679.33 |

* cited by examiner

*Primary Examiner* — Todd M Epps
(74) *Attorney, Agent, or Firm* — ScienBiziP, P.C.

(57) ABSTRACT

A vibration-proof mounting apparatus device is provided for mounting a memory card. The main mounting apparatus comprises a mounting member, a windshield, and an elastic element. The elastic element connects the mounting member and the windshield. The windshield drives the mounting member to move. The windshield presses down against the mounting member and securely holds the memory card for correct connectivity at all times.

14 Claims, 10 Drawing Sheets

MOUNTING APPARATUS FOR MEMORY CARD

FIELD

The subject matter herein generally relates to an apparatus for mounting a memory card.

BACKGROUND

In general, there is a gap between a memory element and a slot. The gap can cause test errors when the motherboard is vibration-tested.

BRIEF DESCRIPTION OF THE DRAWINGS

Implementations of the present technology will now be described, by way of example only, with reference to the attached figures.

DETAILED DESCRIPTION

Figure 1:
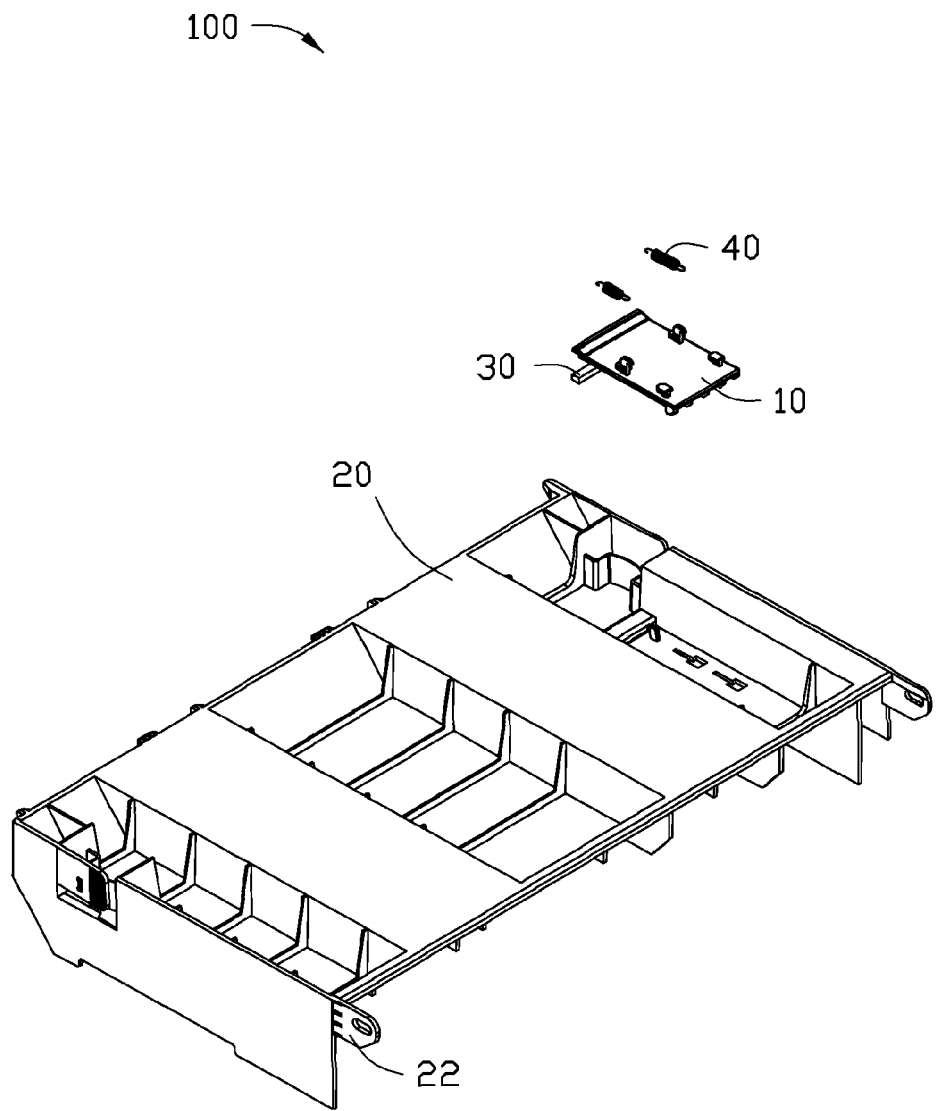
FIG. 1 is an isometric view of an exemplary embodiment of an unassembled mounting apparatus with a mounting member and a windshield.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
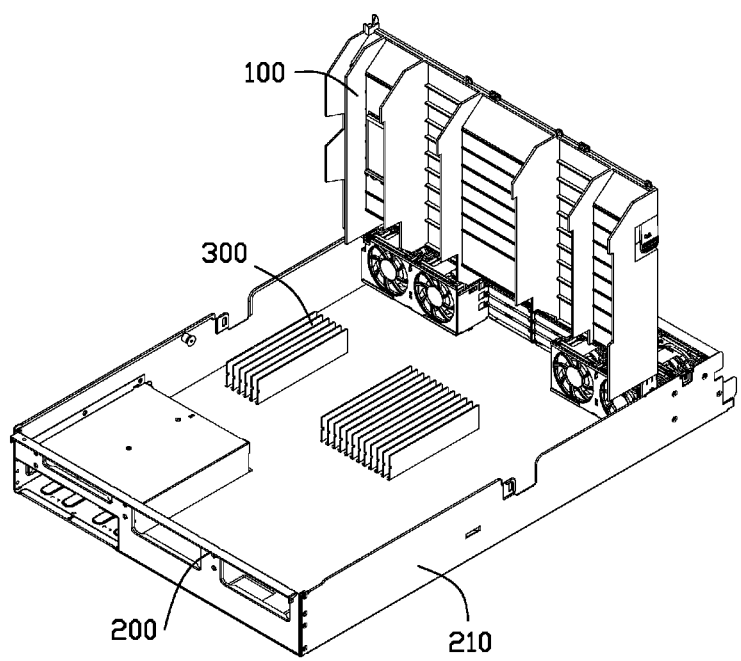
FIG. 2 is an assembled isometric view of the mounting apparatus of FIG. 1 connected to a chassis.

FIG. 1 and FIG. 2 illustrate a mounting apparatus 100 in an exemplary embodiment. The mounting apparatus 100 is provided for mounting a memory card 300 on a chassis 200.

The mounting apparatus 100 comprises a mounting member 10, a windshield 20, a soft cover 30, and an elastic element 40.

The windshield 20 comprises an adapter board 22. The windshield 20 is rotatably attached to a side board 210 of the chassis 200 through the adapter board 22.

Figure 3:
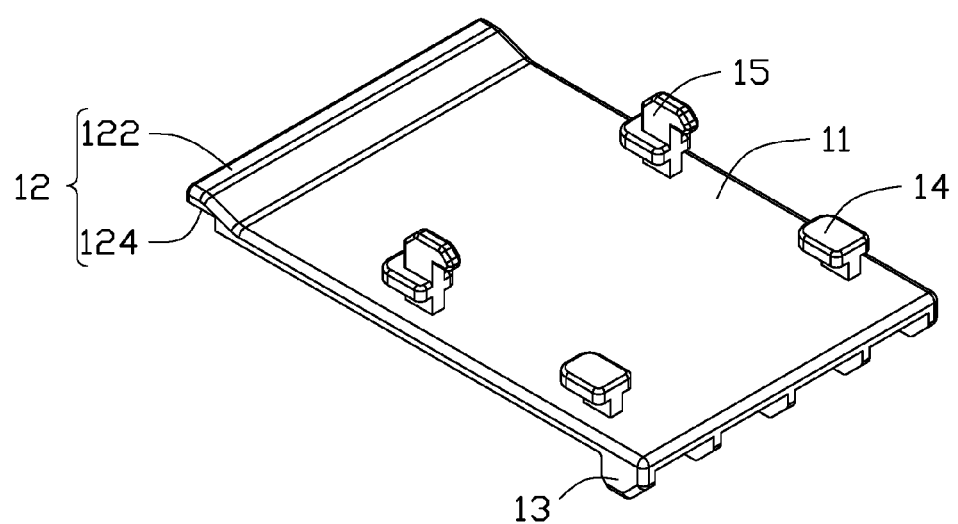
FIG. 3 is an isometric view of the mounting member of FIG. 1.

FIG. 3 illustrates that the mounting member 10 comprises a main portion 11, a flange 12, and a supporting portion 13. The flange 12 is connected to a first end of the main portion 11, and the supporting portion 13 is connected to a second end of the main portion 11.

The flange 12 comprises a top end 122 and a bottom end 124. In the exemplary embodiment, the bottom end 124 of the flange 12 adheres to the soft cover 30 by an adhesive.

In at least one exemplary embodiment, the soft cover 30 is a soft rubber material.

The mounting member 10 further comprises a first sliding portion 14 and a second sliding portion 15. Both the first sliding portion 14 and the second sliding portion 15 are connected to the main portion 11.

In at least one exemplary embodiment, the main portion 11 extends obliquely upward to form the flange 12. The main portion 11 extends vertically downward to form the supporting portion 13.

Figure 4:
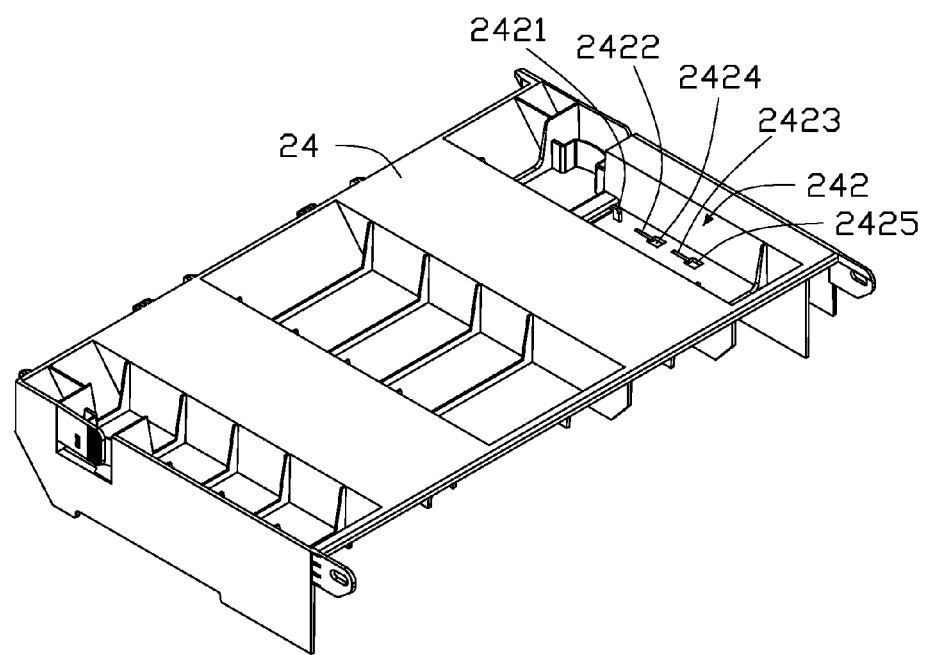
FIG. 4 is an isometric view of the windshield of FIG. 1.
Figure 5:
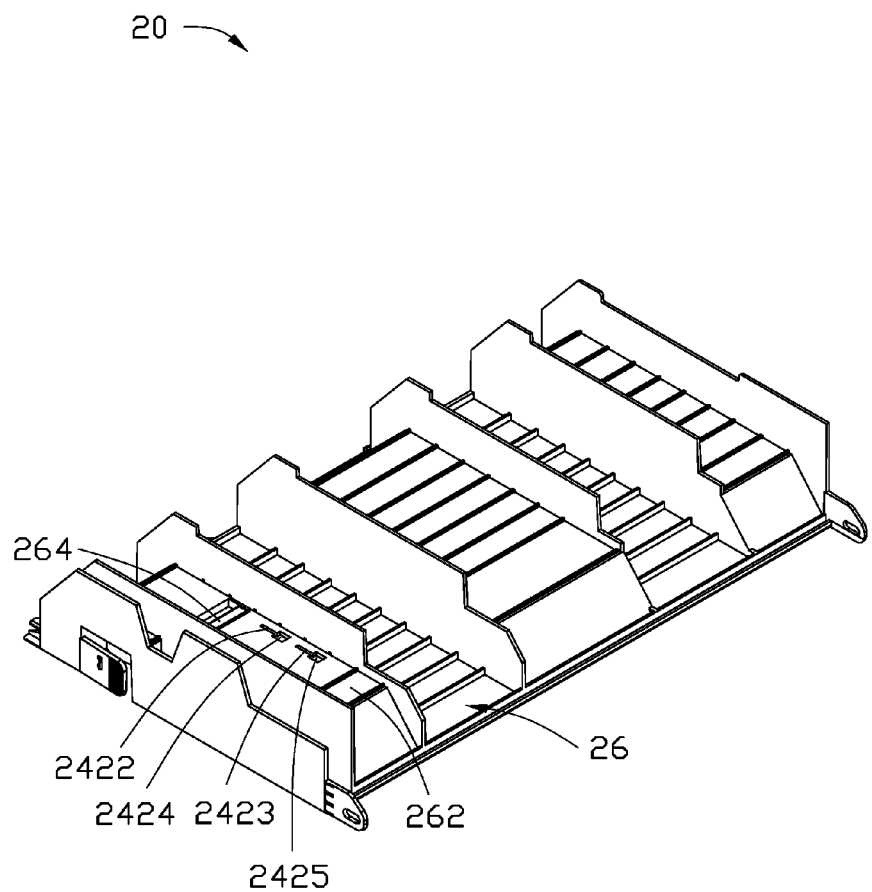
FIG. 5 is another isometric view of the windshield of FIG. 1.

FIGS. 4 and 5 illustrate that the windshield 20 comprises a top surface 24 and a bottom surface 26. The top surface 24 defines a fastening portion 2421, a first slit 2422, a second slit 2423, a first mounting hole 2424, and a second mounting hole 2425. The top surface 24 defines a groove 242, the fastening portion 2421, the first slit 2422, the second slit 2423, the first mounting hole 2424, and a second mounting hole 2425 are accommodated in the groove 242.

The fastening portion 2421 is connected to the first sliding portion 14 through the elastic element 40. In the exemplary embodiment, the elastic element 40 is a spring.

The first slit 2422 is in air communication with the first mounting hole 2424, and the second slit 2423 is in air communication with the second mounting hole 2425. The first mounting hole 2424 and the second mounting hole 2425 respectively correspond to the first sliding portion 14 and the second sliding portion 15.

A bottom surface 262 of the windshield 20 defines a pressing portion 264 that matches the top end 122 of the flange 12.

Figure 6:
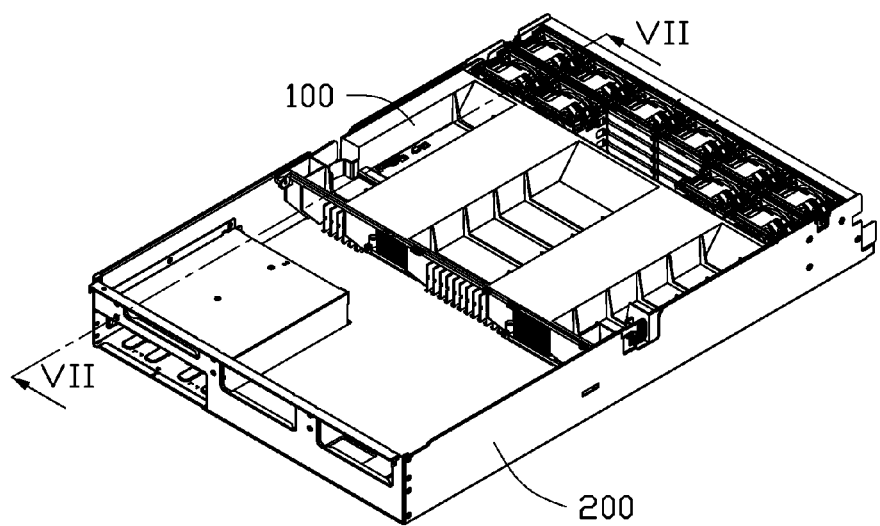
FIG. 6 is an isometric view of the mounting apparatus of FIG. 1 when assembled.
Figure 7:
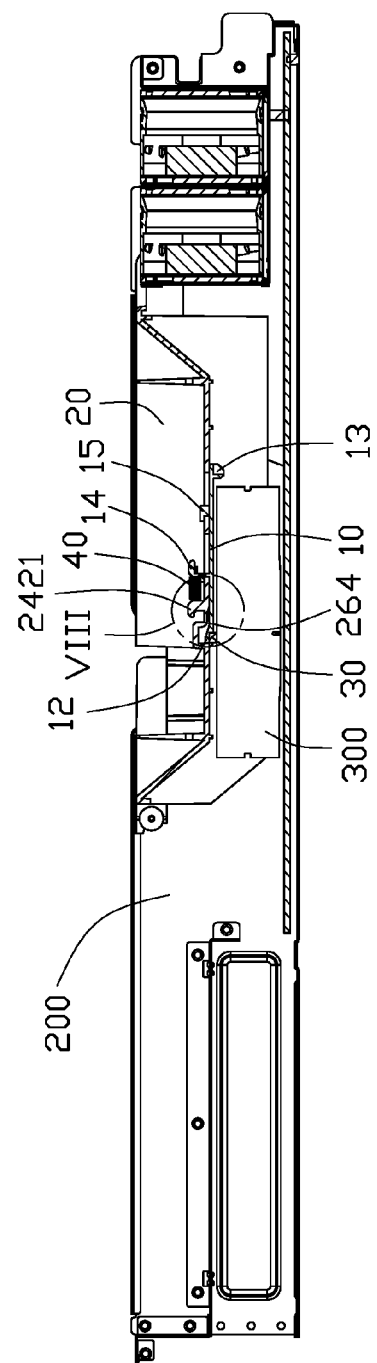
FIG. 7 is a cross-sectional view of the mounting apparatus along line VII-VII of FIG. 6.
Figure 8:
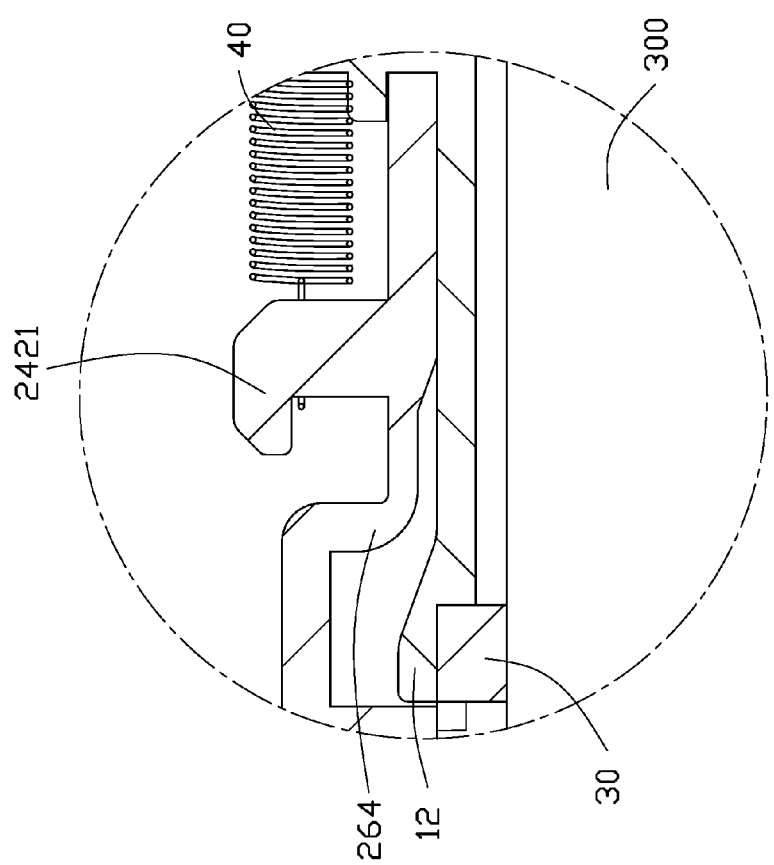
FIG. 8 is an enlarged view of the circled portion VIII of FIG. 7.

Referring to FIGS. 6-8, the soft cover 30 is adhered to the bottom end 124 of the flange 12 and is affixed to the memory card 300 during assembly. The first sliding portion 14 and the second sliding portion 15 of the mounting member 10 respectively pass through the first mounting hole 2424 and the second mounting hole 2425 through the bottom surface 26 of the windshield 20.

After the first sliding portion 14 and the second sliding portion 15 of the mounting member 10 are inserted into the first mounting hole 2424 and the second mounting hole 2425 of the windshield 20, the elastic element 40 is connected between the fastening portion 2421 and the first sliding portion 14. The elastic portion 124 is meanwhile held between the fastening portion 2421 and the first sliding portion 14 to allow the windshield 20 to drive the mounting member 10 to motion.

Figure 9:
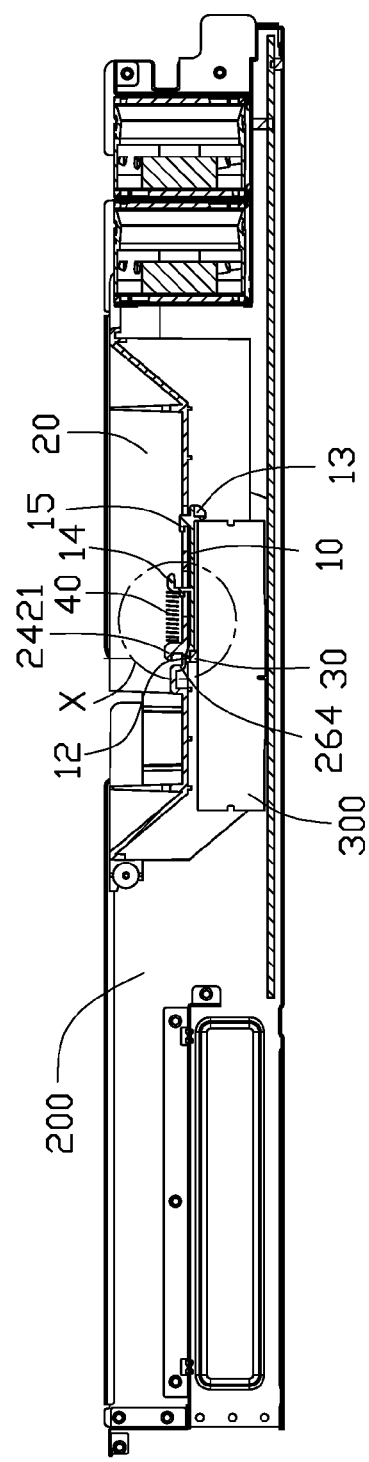
FIG. 9 is a cross-sectional view of the mounting apparatus along line VII-VII of FIG. 6.
Figure 10:
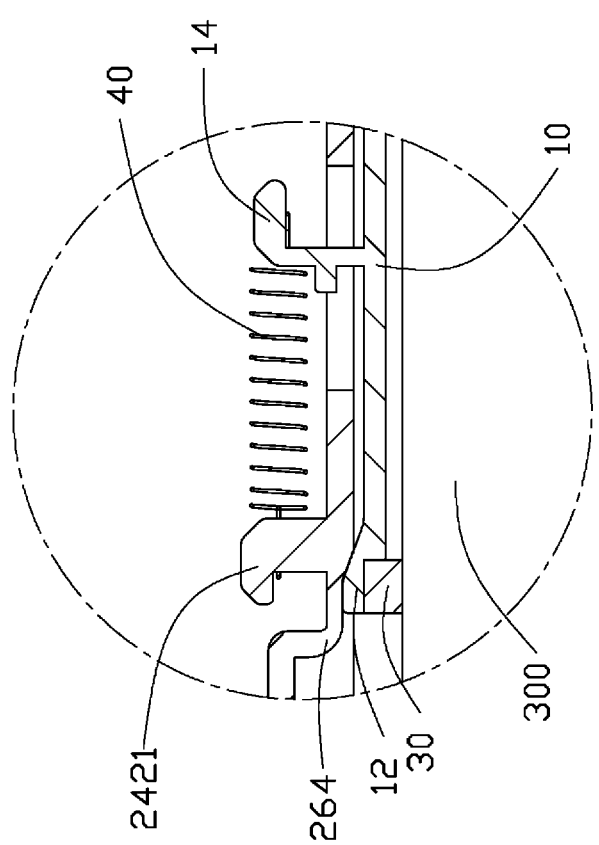
FIG. 10 is an enlarged view of the circled portion X of FIG. 9.

Referring to FIGS. 9 and 10, the windshield 20 is placed in the chassis 200 and the soft cover 30 is affixed to the memory card 300 when in use. The windshield 20 is pushed toward the memory card 300, and then the windshield 20 drives the mounting member 10 to move through the elastic element 40. The supporting portion 13 of the mounting member 10 will be held against the memory card 300, and then the mounting member 10 ceases to move. The windshield 20 and the mounting member 10 are relatively slid through the first slit 2422 and the second slit 2423.

When the windshield 20 is pushed to a correct position, the pressing portion 264 presses down against the flange 12. The soft cover 30 is meanwhile compressed to press against the memory card 30, and the soft cover 30 thus securely holds the memory card 300.

Thus, the mounting apparatus 100 can press the soft cover 30 against the memory card 300, by the mutual cooperation of the windshield 20 and the mounting member 10, to securely secure the memory card 30.

The exemplary embodiments shown and described above are only examples. Many details are often found in the art such as the other features of mounting apparatus. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A mounting apparatus for a memory card, comprising:
    a mounting member comprising a main portion, a flange, and a supporting portion, the flange connected to a first end of the main portion, the supporting portion connected to a second end of the main portion;
    a windshield comprising a fastening portion and a pressing portion; and
    an elastic element connected between the mounting member and the fastening portion;
    wherein when the windshield is pushed in a direction toward the memory card, the windshield drives the mounting member to move through the elastic element, the supporting portion of the mounting member is held against the memory card, the pressing portion presses down against a top end of the flange, and the flange securely holds the memory card.

2. The mounting apparatus of claim 1, wherein the first end of the main portion extends obliquely upward to form the flange, and the second end of the main portion extends vertically downward to form the supporting portion.

3. The mounting apparatus of claim 1, further comprising a soft cover, the soft cover is adhered to a bottom end of the flange and affixed to the memory card.

4. The mounting apparatus of claim 3, wherein when the windshield is pushed in the direction toward the memory card, the windshield drives the mounting member to move through the elastic element, the supporting portion of the mounting member is held against the memory card, the pressing portion presses down against the top end of the flange, and the soft cover securely holds the memory card.

5. The mounting apparatus of claim 4, wherein the mounting member further comprises a first sliding portion and a second sliding portion, the windshield comprises a top surface; the top surface defines a fastening portion, a first slit, a second slit, a first mounting hole, and a second mounting hole; the elastic element is connected between the first sliding portion and the fastening portion; the first slit is in communication with the first mounting hole, the second slit is in communication with the second mounting hole, and the first mounting hole and the second mounting hole respectively correspond to the first sliding portion and the second sliding portion of the mounting member.

6. The mounting apparatus of claim 5, wherein a bottom surface of the windshield defines a pressing portion, and the pressing portion matches the top end of the flange.

7. The mounting apparatus of claim 3, wherein the soft cover is a soft rubber material.

8. The mounting apparatus of claim 1, wherein the elastic element is a spring.

9. A mounting apparatus for a memory card, comprising:
    a mounting member comprising a main portion, a flange, and a supporting portion, the flange connected to a first end of the main portion, the supporting portion connected to a second end of the main portion;
    a windshield comprising a fastening portion and a pressing portion;
    an elastic element connected between the mounting member and the fastening portion; and
    a soft cover adhered to a bottom end of the flange and affixed to the memory card;
    wherein when the windshield is pushed in a direction toward the memory card, the windshield drives the mounting member to move through the elastic element, the supporting portion of the mounting member is held against the memory card, the pressing portion presses down against a top end of the flange, and the soft cover securely holds the memory card.

10. The mounting apparatus of claim 9, wherein the first end of the main portion extends obliquely upward to form the flange, and the second end of the main portion extends vertically downward to form the supporting portion.

11. The mounting apparatus of claim 9, wherein the mounting member further comprises a first sliding portion and a second sliding portion, and the windshield comprises a top surface; the top surface of the windshield comprises a groove, the groove defines a fastening portion, a first slit, a second slit, a first mounting hole, and a second mounting hole; the elastic element is connected between the first sliding portion and the fastening portion; the first slit is communicated with the first mounting hole, the second slit is communicated with the second mounting hole, and the first mounting hole and the second mounting hole respectively correspond to the first sliding portion and the second sliding portion of the mounting member.

12. The mounting apparatus of claim 11, wherein a bottom surface of the windshield defines a pressing portion, and the pressing portion matches the top end of the flange.

13. The mounting apparatus of claim 9, wherein the soft cover is a soft rubber material.

14. The mounting apparatus of claim 9, wherein the elastic element is a spring.

* * * * *